United States Patent [19]

Spigarelli et al.

[11] Patent Number: 5,309,545
[45] Date of Patent: May 3, 1994

[54] COMBINED RADIATIVE AND CONVECTIVE REWORK SYSTEM

[75] Inventors: Donald J. Spigarelli, Groton, Mass.; John M. DeCarlo, York, Me.; John A. Romano, Billerica; William F. Drislane, N. Chelmsford, both of Mass.

[73] Assignee: Sierra Research and Technology, Inc., Westford, Mass.

[21] Appl. No.: 749,116

[22] Filed: Aug. 23, 1991

Related U.S. Application Data

[63] Continuation-in-part of Ser. No. 660,657, Feb. 22, 1991, which is a continuation-in-part of Ser. No. 573,500, Aug. 27, 1990, Pat. No. 5,060,288.

[51] Int. Cl.⁵ .................... B23K 1/005; B23K 1/012
[52] U.S. Cl. .................... 392/419; 392/420; 392/379; 219/85.12; 228/6.2
[58] Field of Search .................... 392/419-421, 392/379, 382, 407, 409, 410; 219/85.12, 85.13; 228/6.2, 105

[56] References Cited

U.S. PATENT DOCUMENTS

| | | | |
|---|---|---|---|
| 2,861,166 | 11/1958 | Cargill, Jr. | 392/420 |
| 3,283,124 | 11/1963 | Kawecki | 219/85.12 |
| 3,586,813 | 6/1971 | Cruickshank et al. | 219/85.12 |
| 3,592,992 | 7/1971 | Costello | 219/85.12 |
| 3,621,198 | 11/1971 | Herbrich | 219/85.12 |
| 3,649,811 | 3/1972 | Schoenthaler | 219/85.12 |
| 3,683,146 | 8/1972 | Nugent et al. | 219/85.12 |
| 3,718,800 | 2/1973 | Costello | 219/85.12 |
| 3,912,153 | 10/1975 | Hartleroad et al. | 228/6.2 |
| 4,111,142 | 9/1978 | Kawamata | 392/379 |
| 4,552,300 | 11/1985 | Zovko et al. | 392/379 |
| 4,564,135 | 1/1986 | Barresi et al. | 228/6.2 |
| 4,610,388 | 9/1986 | Koltuniak et al. | 228/6.2 |
| 4,626,205 | 12/1986 | Barkley et al. | 392/379 |
| 4,650,950 | 3/1987 | Hayakawa et al. | 219/85.12 |
| 4,685,200 | 8/1987 | Bokil | 219/85.12 |
| 4,720,617 | 1/1988 | Hayakawa et al. | 219/85.12 |
| 4,752,025 | 6/1988 | Stach et al. | 228/9 |
| 4,787,548 | 11/1988 | Abbagnaro et al. | 228/6.2 |
| 4,805,827 | 2/1989 | Coffman et al. | 228/20 |
| 4,960,972 | 10/1990 | Nakamura et al. | 219/85.12 |
| 5,152,447 | 10/1992 | Wallgren et al. | 228/6.2 |
| 5,196,667 | 3/1993 | Gammelin | 219/85.12 |

FOREIGN PATENT DOCUMENTS

| | | | |
|---|---|---|---|
| 2884 | 7/1979 | European Pat. Off. | 228/6.2 |
| 61-16968 | 7/1986 | Japan | 219/85.12 |
| 62-3269 | 1/1987 | Japan . | |
| 62-113866 | 7/1987 | Japan . | |
| 62-219464 | 3/1989 | Japan | 219/85.12 |
| 2-41771 | 2/1990 | Japan | 392/379 |
| 1459832 | 2/1989 | U.S.S.R. | 219/85.12 |
| 2038220 | 6/1980 | United Kingdom | 219/85.12 |

*Primary Examiner*—Bruce A. Reynolds
*Assistant Examiner*—John A. Jeffery
*Attorney, Agent, or Firm*—Weingarten, Schurgin, Gagnebin & Hayes

[57] ABSTRACT

A combined radiative and convective rework system is provided for repair, replacement, removal and rework of an electronic component on a printed circuit board. The system includes a guide for guiding heat-inducing radiation and heated gas towards at least one lead of the electronic component, and for preventing the heat-inducing radiation from damaging the body of the component. A heater, including a source of infrared radiation, provides the heat-inducing radiation and the heated gas. In one embodiment, the guide includes a single funnel cooperative with apparatus for reducing component body heating. In second and third embodiments, the guide includes two concentric funnels which form a volume which is traversed by the heat-inducing radiation and heated gas, and which provide at least one narrow region of heat energy to at least one of the leads, but not directly to the component body. In another embodiment, a plurality of removable guides are provided, each being specialized for use with a variety of different component types and sizes. The system also includes a viewing system for viewing the component along a central axis of symmetry of the guide.

12 Claims, 6 Drawing Sheets

COMBINED RADIATIVE AND CONVECTIVE REWORK SYSTEM

RELATED UNITED STATES APPLICATIONS

This application is a continuation-in-part of commonly owned co-pending patent application Ser. No. 07/660,657, filed Feb. 2, 1991, which is a continuation-in-part of Ser. No. 07/573,500, filed Aug. 27, 1990 now U.S. Pat. No. 5,060,288.

FIELD OF THE INVENTION

This invention relates to component rework systems, and particularly to a component rework system for use with surface mountable electronic components.

BACKGROUND OF THE INVENTION

It is frequently necessary to place, remove, or repair an electronic surface mounted component on a printed circuit board (PCB). Electronic components are typically bonded to the PCB with a solder material that has a melting point above the maximum operating temperature of the component, but sufficiently low so that only a small quantity of thermal energy is needed to melt the material. Thermal energy can be transferred via conduction, such as by a soldering iron; via convection, by means of forced hot air; or via radiation, as provided by an infrared lamp, for example.

It is known to apply a stream of hot air or other chemically inert gas to provide localized convective heating of the leads of a component. For example, a typical surface mounted component is square or rectangular, with leads that project outwardly from each of its four sides. If the component is square, a round region of hot air or hot gas centered on the component must be large enough to include the leads so that they receive direct exposure to the hot air. However, if the region is large enough to heat all of the leads, then the component is exposed to an excess of thermal energy, the excess energy potentially damaging the component. Also, the hot air undesirably heats up surrounding areas of the PCB and neighboring components. This not only may damage adjacent components but also may ultimately result in warpage or delamination of the PCB. An analogous problem arises when a round region of infrared illumination impinges upon all the leads of a component; the region necessarily includes the component itself, possibly causing damage to the component. Also, adjacent components can be damaged as well due to over heating and possible melting of their solder joints.

It is also known to supplement the above infrared heating with forced hot air or hot gas directed towards the location of the component from a position under the PCB to provide preliminary conductive heating to the component. However, since surface mounted components are commonly found on both sides of a PCB, this method of heating can result in overheating and damage to the components exposed to the forced hot air.

SUMMARY OF THE INVENTION

A combined radiative and convective rework system is provided for repair, replacement, removal and rework of an electronic component on a printed circuit board. The system includes a variety of guiding means for guiding heat-inducing radiation and heated gas towards at least one lead of the electronic component, and for substantially preventing the heat-inducing radiation from impinging upon the body of the component. The guiding means has a receiving end for receiving heat-inducing radiation and/or heated gas, and a delivery end for delivering heat-inducing radiation and/or a stream of heated gas. Heating means, such as a source of infrared radiation, provides the heat-inducing radiation and heats the gas. In a preferred embodiment, the guiding means includes two concentric funnels that form a volume which is traversed by the heat-inducing radiation and heated gas, and provides at least one narrow region of heat energy to at least one of the leads, but not directly to the component body. In another preferred embodiment, a single funnel is used. Because of expansion of heating gas into the volume defined by the single funnel, substantially no heated gas reaches the electronic component at the receiving end. A third embodiment also uses the dual funnel but with high temperature matrix material within the volume defined by the concentric funnels. Gas is heated both in passing across the hot lamps and through contact with the IR-heated matrix material. The system also includes a viewing system for viewing the component along a central axis of symmetry of the guiding means.

The system of the invention provides simultaneous viewing of all four sides of leads and pads to facilitate active lead-to-pad matching. High resolution coaxial optics provides extremely accurate registration and alignment of electronic components with respect to corresponding pads on a PCB. Furthermore, since significant power may be applied for both radiative and convective heating, double-sided boards can be repaired or reworked without the need for preheating the underside of the PCB. In cases where only radiative or convective or radiative and convective heating is called for, the appropriate heat source for the job can be applied with the proper tool.

DESCRIPTION OF THE DRAWINGS

The invention will be more fully understood from the following detailed description, in conjunction with the accompanying figures in which.

DETAILED DESCRIPTION OF THE INVENTION

Figure 1:
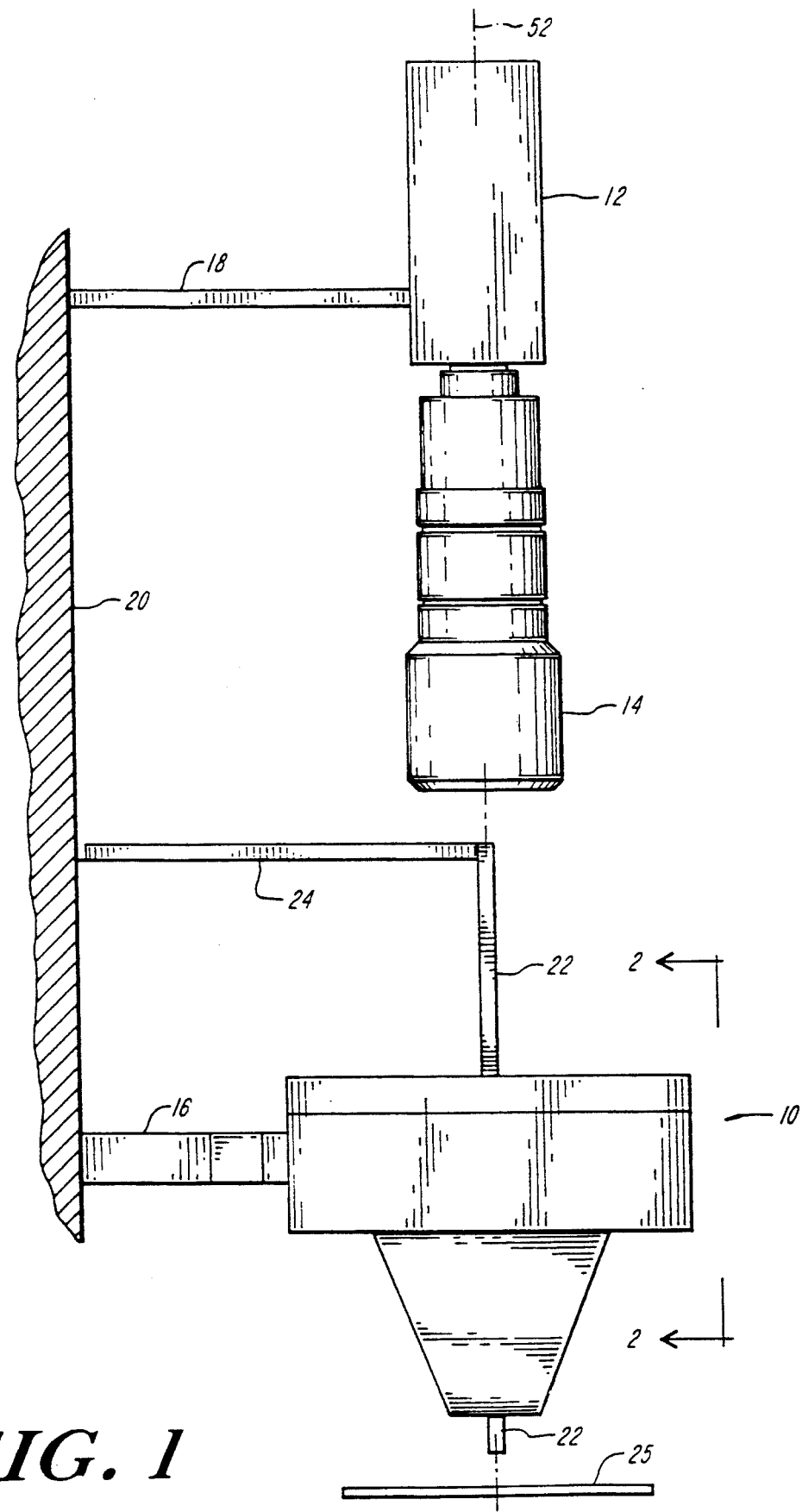
FIG. 1 is a side view of an embodiment of the system of the invention.

With reference to FIG. 1, an embodiment of the combined infrared and convection rework system 10 is shown in cooperation with a coaxially mounted video camera 12 that includes a magnifying lens system 14. For example, a high resolution color video camera with an 18-108 mm zoom lens, the camera being connected to a 13" color monitor can be used. The rework system 10 and the video camera 12 are supported by support members 16 and 18, respectively, each of which is mounted on a support structure 20. The support structure 20 can include means for adjusting the height and relative separation distances of the system 10 and the camera 12, as is well known in the art. In particular, the member 18 is adjusted to rest at a position required by the working distance of the lens system 14, the working distance being a characteristic of the particular lens system configuration used.

A vacuum pick-up tube 22 is generally coaxially disposed with respect to the system 10 and the camera 12, and is supported by a member 24 for moving the tube 22 both upward and downward so as to pick up and deposit a component that is the object of replacement, repair, or rework. In a preferred embodiment, the member 24 can assume at least three positions: UP; in which the pick-up tube 22 is positioned a significant distance above the component; NEAR PLACE, for facilitating alignment and positioning of the component prior to placement; and PLACE, for depositing the component on the PCB or removing the component from the PCB. The lens system 14 is useful in aligning and placing a component, and in some instances where exceptionally precise alignment is required, a lens system with the magnifying power of a microscope can be employed.

Figure 2:
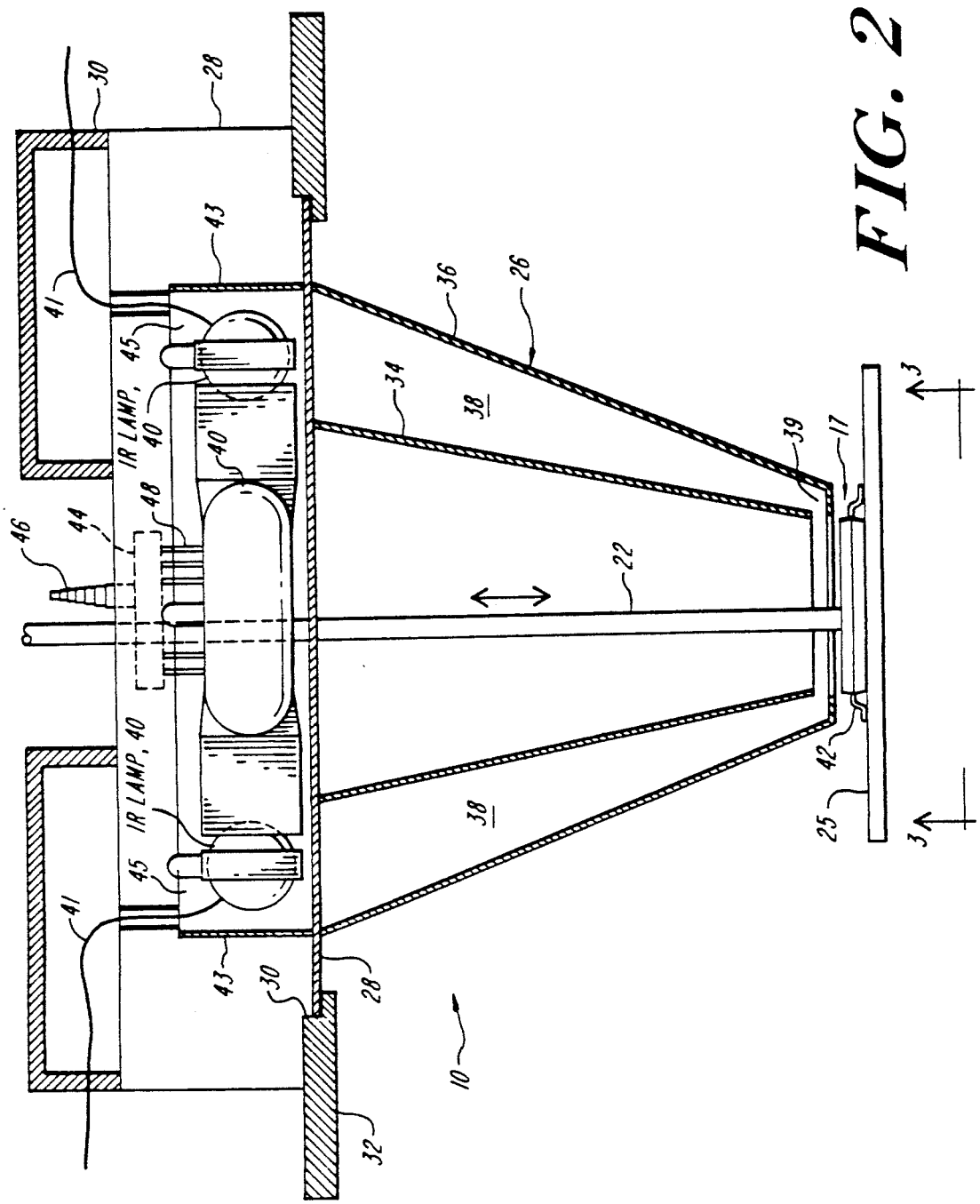
FIG. 2 is a partially cut-away side view of an embodiment of a tool assembly for producing IR radiative and hot gas convective heating with its lamp housing and cover.

Referring to FIG. 2, the rework system 10 utilizing both hot gas convective and IR radiative heating includes a tool assembly 26, a lamp housing 28, and a cover 30. The tool assembly 26 has a tool mounting plate 29 that rests on a ledge 30 of a supporting structure 32 that is itself supported by the support member 16 (FIG. 1). The tool assembly can be removed and replaced, as when a tool of a different size is required corresponding to a different size component 17 to be reworked, or when a different combination of radiative and convective heating is needed, by sliding the assembly over the ledge 30 and away from the support member 16, as shown in FIG. 1.

Figure 3:
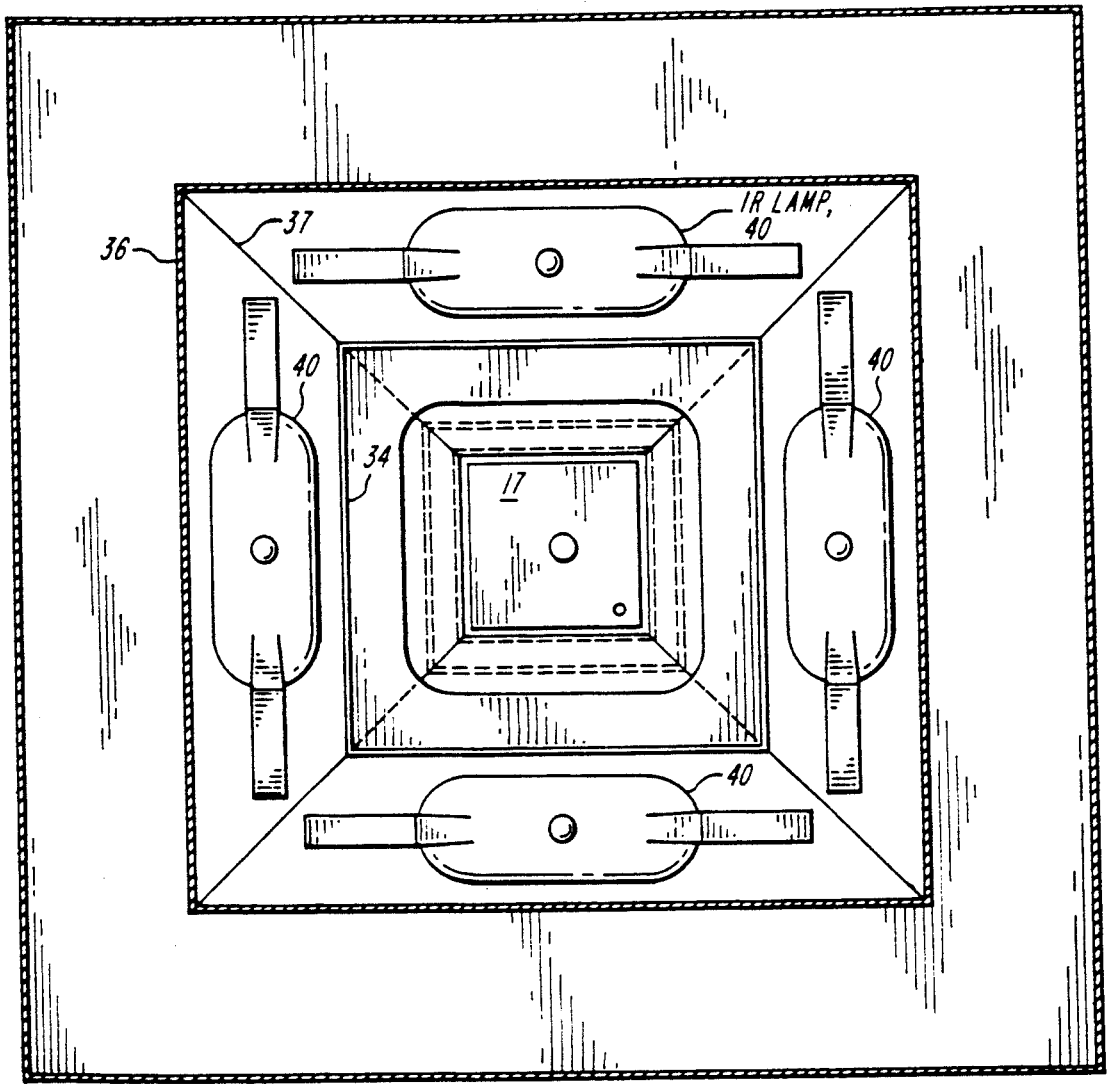
FIG. 3 is a wire-frame top view of the tool assembly with its lamp housing and cover.

In one embodiment 10, the tool assembly 26 also has an inner funnel 34 with converging walls and a square or rectangular cross-section, the shape of the cross-section corresponding to the shape of the component 17 to be reworked, and a similarly shaped outer funnel 36 in concentric relationship with the inner funnel 34. The walls of the funnels 34 and 36 form a space 38 through which infrared radiation passes from each of the lamps 40 to the leads 42 of the component 17, and therefore possess a highly reflective surface on each wall that bounds the space 38. Consequently, infrared radiation can pass either directly from each lamp 40 to the leads 42 of the component 17, or indirectly by one or more reflections before reaching the leads 42. The space 38 terminates at its narrow end in a rectilinear annular passage 39, being 0.15" wide, for example. Alternatively, if the funnels 34 and 36 are joined for structural reinforcement along each of their four vertices by a respective bracing wall 37, as shown in FIG. 3, the space 38 is partitioned into four cells that each terminate in a trapezoidal passage. Regardless of the presence or absence of bracing walls, only the leads 42 of a component 17 will be exposed to radiant energy from the lamps 40 and to direct exposure to a flow of forced hot gas flowing through the space 38, thereby sparing the body of the component 17 from exposure to excessive thermal energy. The concurrent application of IR and hot gas convective heating raises the lead temperature sufficiently to permit reflow of solder. It should be noted that the addition of hot gas convective heating to the IR radiative heating reduces the effect of surface reflectance of the leads.

Four lamps 40 are used. In one embodiment, the lamps are each 500 Watt quartz-halogen bulbs that provide high intensity infrared illumination, and obtain electrical power via the wires 41. Each lamp 40 is preferably coated with a reflective material, such as gold or aluminum, over approximately five sixths of its surface, leaving a narrow, uncoated, downward-facing strip parallel to a nearby funnel wall and facing the space 38 so as to permit infrared radiation to exit the bulb 40 and traverse the space 38. Alternatively, the inner surfaces of the walls 43 of each cavity 45 within which each lamp 40 is located can be coated with the reflective material, leaving the lamps uncoated.

Each cavity 45 is cooled by air or other gas that is injected into a plenum 44 via a forced air or gas source that is connected to the hose fitting 46.

Figure 5:
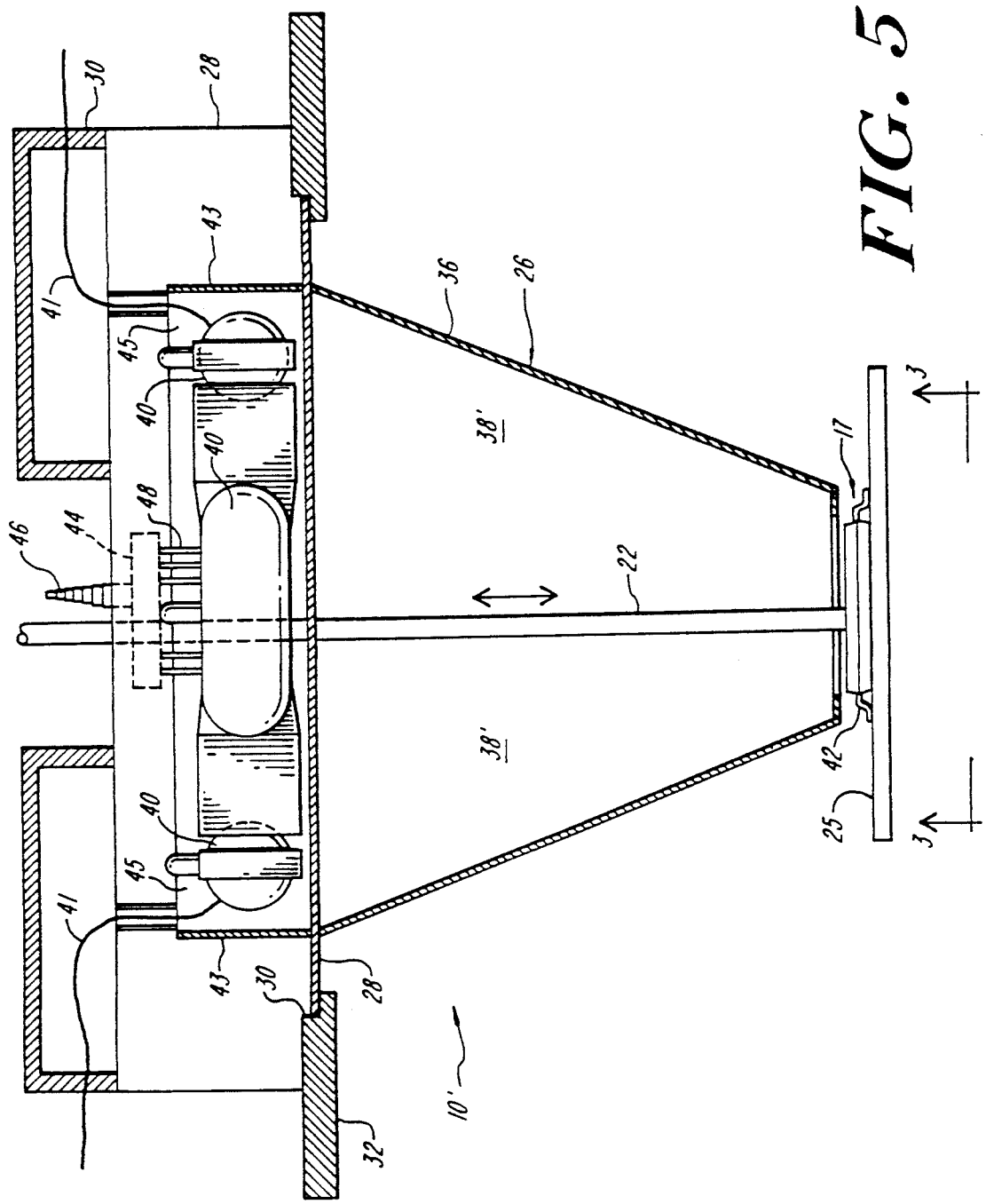
FIG. 5 is a partially cut-away side view of an embodiment of a tool assembly for producing IR radiative heating with its lamp housing and cover.
Figure 6:
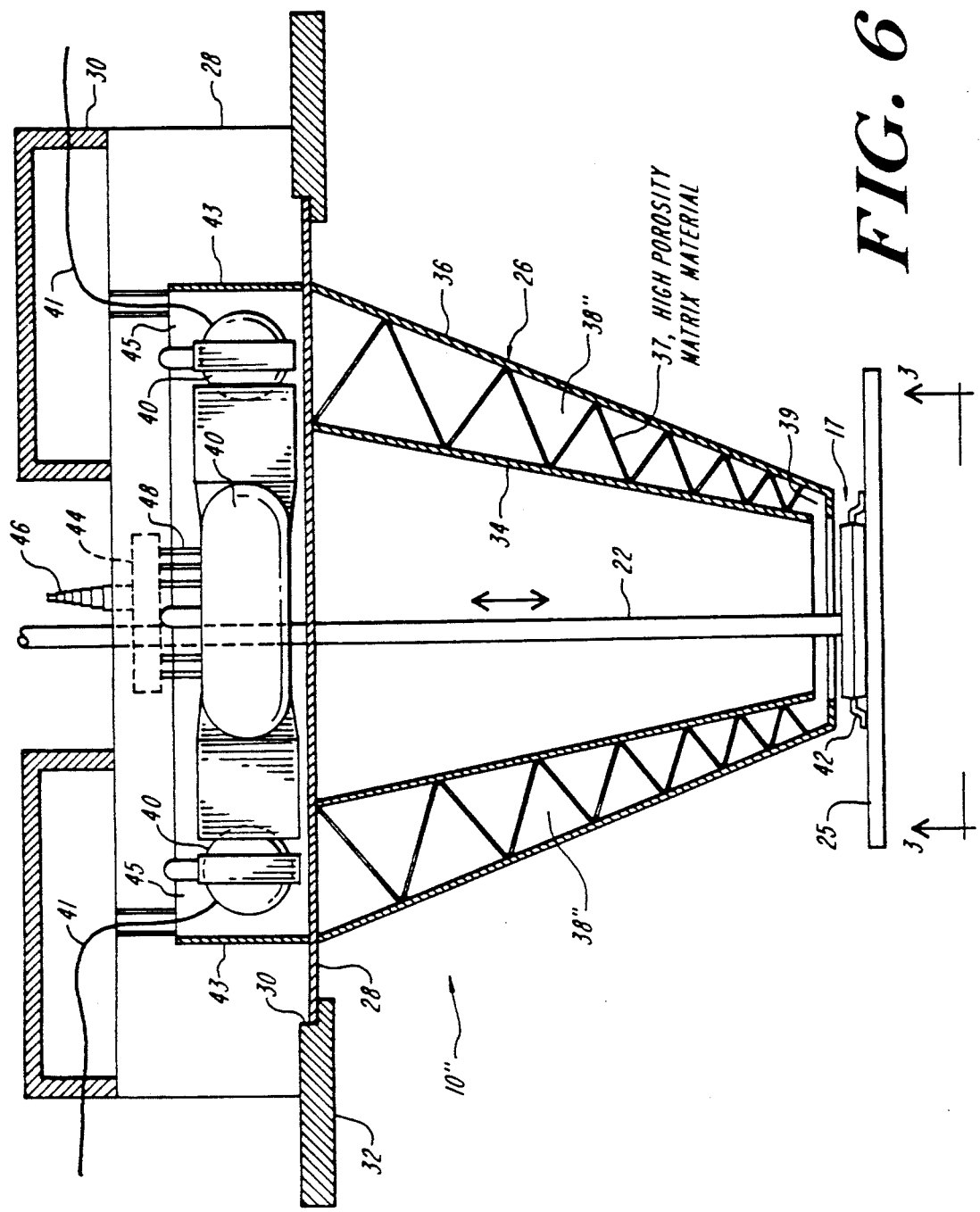
FIG. 6 is a partially cut-away side view of an embodiment of a tool assembly for producing hot gas convective heating with its lamp housing and cover.

In the embodiment shown, the source can supply forced air or gas at a rate of 200 cubic feet per hour at a pressure of 80–100 PSI. The air or gas is clean, dry, oil-free and filtered to 0.5 micron. The air or gas enters the cavity 45 via a plurality of microchannels 48, the present embodiment including five microchannels 48, each being 0.070" in diameter, for example. In a second embodiment 10' shown in FIG. 5, the leads 42 of a component 17 are intended to be heated solely by irradiation with infrared radiation from the lamps 40. In this embodiment, one funnel 36, having a reflective inner surface is used. This single funnel 36 channels both the direct and reflected IR radiation to the leads. It should be noted that the lamp cooling gas or air introduced at a rate of approximately 100 cubic feet per hour via the microchannels 48 into the cavity 38' expands in the enclosed volume and results in insignificant additional component heating. In a third embodiment 10", shown in FIG. 6, wherein the leads 42 are to be heated by forced concentrated hot gas supplied at a rate of approximately 200 cubic feet per hour, the gas or air flows over the lamps 40 and down through the space 38" before impinging upon the leads 42 of the component 17. The space 38,, is filled with a high-porosity, high-temperature matrix material 37, for example, metal screening, metal mesh, or steel wool. Such a matrix material 37 must not only be able to withstand the heating by the IR source 40 but must have adequate porosity to minimize its resistance to the flow of the heating gas.

Figure 4:
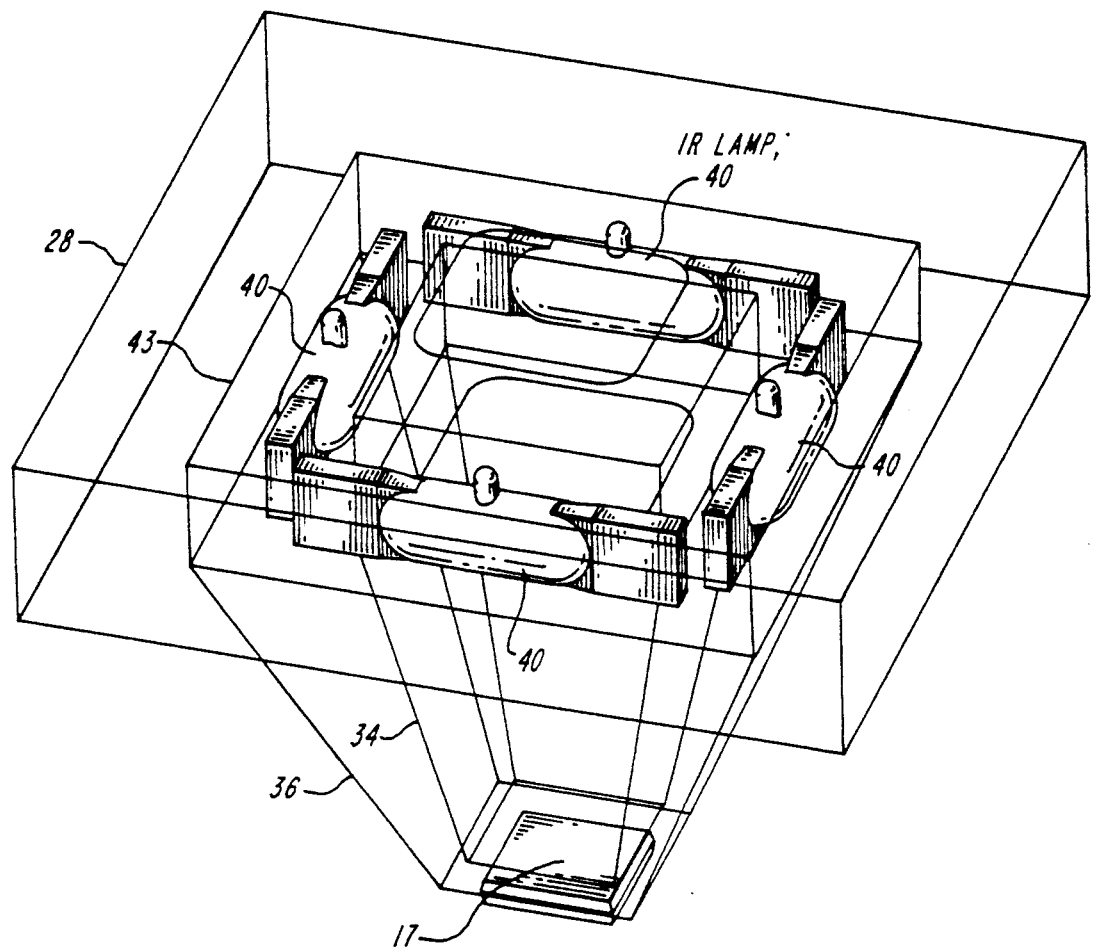
FIG. 4 is a top view of the tool assembly showing each of four lamps.

To use the system of the invention, a component 17 is placed directly under and generally concentric with the vacuum pick-up tube 22, as shown in FIGS. 2, 3, and 4. To retrieve a component 17, the vacuum pick-up tube 22 is lowered and placed in contact with the body of the component 17. Next, a vacuum source (not shown) attached to the tube 22 creates a vacuum at the end of the tube 22 contacting the component 17 that attracts it to the tube with a force sufficient to lift the component 17. The PCB site and the component 17 are aligned vertically. The component 17 is then lowered to a Near-Place position for final alignment with the PCB site. The leads of the component can then be soldered in place on the PCB using a heating modality corresponding to the particular tool selected.

Subsequently, in the mode that only employs infrared radiation, all four of the lamps 40 are illuminated until the solder for fixing the component 17 to the board 25 melts. In a mode that employs both forced hot air and infrared radiation, hot air is first directed upon the leads 42 of the component 17 to heat them to a temperature just below the melting point of the solder, and then the infrared radiation is allowed to briefly illuminate and thereby heat the solder to its melting point. In another mode that uses only forced hot air, air of sufficient heat and duration impinges upon the leads until the solder melts.

Considering the operation of the system in more detail, to align the component 17, the leads 42 of the component 17 are visually aligned with their corresponding pads on the PCB 25 along each of the four sides of the component 17. Since the video camera 12 and lens system 14 provide a direct overhead view of all of the leads of a component simultaneously, it is possible to efficiently achieve highly accurate registration during the brief period that the solder is in a molten condition. To achieve especially accurate registration, the camera 12 can be provided with a zoom lens system or a microscope, and extremely fine adjustments can be made with great precision, even while thermal energy is being applied to the leads.

Overhead viewing is further enhanced by the configuration of the pick-up tube 22. Since it is coaxial with the viewing axis 52 of the video camera 12, it appears as a minimal thin disk over the center of the body of the component 17. The member 24 has a very thin overhead profile, and is disposed close to the lens assembly 14, so its presence in the field of view of the camera 12 is barely detectable.

After alignment with the site, the component 17 either may be retained in its NEAR PLACE position (just above the pads) for heating the solder to a reflow temperature before placing the component in contact with the pads (termed reflow-before-place) or the component may be first placed against the pad and then the solder reflowed (termed place-before-reflow).

Any of the three heating modes may be employed for the reflow-before-place or place-before-reflow cycles. However, IR heating with active device cooling cannot be used for reflow-before-place, since the component must first be placed in position and released to allow the pick-up tube 22 to be lifted slightly to allow cooling gas, such as nitrogen, to flow onto the component. The use of the pick-up tube 22 for delivering the cooling gas prevents the pick-up tube 22 for providing a vacuum to hold the component. Depending upon the required application, the heating sources may be used for placement, removal, or re-alignment of a component.

In a heating mode using only infrared heating, all four of the lamps 40 are illuminated. Infrared energy impinging directly on the component body and leads is supplemented by infrared energy reflected both from the reflective material of the lamps and from multiple reflections on the reflective walls of the single funnel tool. Cooling air, heated by the lamps, expands into the enclosed volume within the tool and produces insignificant heating of the component as previously discussed. Component body heating may be further reduced by preheating the bottom side of the PCB and using a lower power level with the lamps, reducing the top side reflow period, or by using of active component cooling via the pick up tube 22.

In a heating mode employing both infrared heating and forced convection heating, the dual funnel tool is used. Incoming lamp cooling air is heated as it washes over the lamp surfaces. The gas is directed downward between the nested concentric funnels 34,36 to exit at the bottom where it heats the component leads 42 of component 17. The IR heating source (from both direct and reflected infrared energy) is used in conjunction with the focused convection heat source. Heating of component leads 42 by combined IR and forced convective heating of the component leads continues until the melting point of the solder is exceeded.

In a heating mode using only forced convection, the dual funnel tool is used, incorporating a heat conducting matrix material between funnels. Incoming lamp cooling air is heated as it washes the lamp surfaces, and the gas absorbs additional energy as it passes through the matrix material which is heated from above by direct and reflected IR energy. The heated air stream is directed downward to impinge on leads 42 until the solder melts.

After acceptable registration has been achieved in a placement operation, the tube 22 pushes down component 17 with a previously determined force and maintains contact with the component during reflow. Application of this placement force serves to improve component lead coplanarity with the PCB site during the period that the solder is molten.

Once the solder has melted, the component 17 can be removed and replaced, or simply realigned.

The mode that employs only IR heating is optimally suited to leaded devices. The design of the single funnel tool serves to maintain thermal separation between the component being soldered and adjacent components on the PCB.

The mode that combines IR exposure and convective heating using forced hot air is effective for non-leaded devices, such as plastic leaded chip carriers (PLCC's). In this mode, devices which are particularly vulnerable to heat damage can avoid exposure to the extreme heat employed when solely IR is used and the lamps 40 are energized at full power. Also, shorter cycle times are possible compared with solely IR heating.

The mode that uses only convective heating is best applied where a broad range of temperatures is needed, and is optimal for non-leaded devices. Further, it has the fastest cycle time of the three embodiments.

Other modifications and implementations will occur to those skilled in the art without departing from the spirit and the scope of the invention as claimed. Accordingly, the above-description is not intended to limit the invention except as indicated in the following claims.

What is claimed is:

1. A combined radiative and convective rework system for repair, replacement, removal and rework of an electronic component on a printed circuit board, the electronic component having leads and a component body, the system comprising:

a guide for guiding heat-inducing radiation towards at least one lead of said electronic component, said guide having a receiving end for receiving said heat-inducing radiation, and a delivery end for delivering said heat-inducing radiation;

a heater, connected to the receiving end of said guide, for providing said heat-inducing radiation; and a pickup tube, extending through and generally concentric with said guide, for picking up and cooling said component body.

2. The combined radiative and convective rework system of claim 1 wherein said guide includes two concentric funnels that form a volume which is traversed by heat-inducing radiation and heated gas.

3. The combined radiative and convective rework system of claim 2 wherein said funnels that bound said volume also secularly reflect heat-inducing radiation.

4. The combined radiative and convective rework system of claim 1 wherein said delivery end for delivering said heat-inducing radiation and a stream of said heated gas provides at least one narrow region of heat energy to at least one of said leads, but not directly to said component body.

5. The combined radiative and convective rework system of claim 1 further including a viewing system for viewing said component along a central axis of symmetry of said guide.

6. The combined radiative and convective rework system of claim 5 wherein said viewing system is disposed such that its optical axis is disposed in coaxial relationship with said guide.

7. The combined radiative and convective rework system of claim 1 wherein said heater includes a plurality of sources of infrared radiation.

8. The combined radiative and convective rework system of claim 7 wherein said heater includes four sources of infrared radiation.

9. The combined radiative and convective rework system of claim 7 wherein the plurality of sources of infrared radiation are cooled by a source of forced gas.

10. The combined radiative and convective rework system of claim 9 wherein the source of forced gas includes a plenum and a plurality of microchannels.

11. The combined radiative and convective rework system of claim 7 wherein each source of infrared radiation includes a reflective surface for directing infrared radiation into said receiving end of said guide.

12. The combined radiative and convective rework system of claim 1 further comprising:
  a frame, having at least one cavity, coupled to the receiving end of said first and second removable guides; and
  a hose, coupled to said heater and said frame, said hose for transmitting fluid from said heater to the at least one cavity in said frame.

* * * * *

UNITED STATES PATENT AND TRADEMARK OFFICE
CERTIFICATE OF CORRECTION

PATENT NO. : 5,309,545
DATED : May 3, 1994
INVENTOR(S) : Donald J. Spigarelli, et al.

It is certified that error appears in the above-indentified patent and that said Letters Patent is hereby corrected as shown below:

Column 4, line 43, "38,," should read --38"--.

Signed and Sealed this

Twentieth Day of December, 1994

Attest:

BRUCE LEHMAN

Attesting Officer     Commissioner of Patents and Trademarks